United States Patent
Kanayama

(10) Patent No.: US 9,372,216 B2
(45) Date of Patent: Jun. 21, 2016

(54) ELECTRIC POWER SUPPLY CONTROLLER FOR VEHICLE

(71) Applicant: DENSO CORPORATION, Kariya, Aichi-pref. (JP)

(72) Inventor: Mitsuhiro Kanayama, Takahama (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/488,467

(22) Filed: Sep. 17, 2014

(65) Prior Publication Data

US 2015/0088354 A1 Mar. 26, 2015

(30) Foreign Application Priority Data

Sep. 20, 2013 (JP) .................................. 2013-195859
Jul. 14, 2014 (JP) .................................. 2014-144426

(51) Int. Cl.
| H02J 7/00 | (2006.01) |
| G01R 27/02 | (2006.01) |
| B60L 11/18 | (2006.01) |
| G01R 31/04 | (2006.01) |
| G01R 31/00 | (2006.01) |

(52) U.S. Cl.
CPC .............. *G01R 27/02* (2013.01); *B60L 11/1824* (2013.01); *G01R 31/045* (2013.01); *G01R 31/007* (2013.01)

(58) Field of Classification Search
USPC ........................... 701/22; 320/109; 180/65.29
See application file for complete search history.

(56) References Cited

U.S. PATENT DOCUMENTS

| 2010/0295507 A1* | 11/2010 | Ishii ........................ B60K 6/445 320/109 |
| 2012/0098490 A1* | 4/2012 | Masuda ................ B60L 3/0069 320/109 |

FOREIGN PATENT DOCUMENTS

| JP | 8-288051 | 11/1996 |
| JP | 2009-171733 | 7/2009 |
| JP | 2009-216618 | 9/2009 |
| WO | WO2010/150360 | 12/2010 |

OTHER PUBLICATIONS

Office Action dated Aug. 18, 2015 in corresponding Japanese Application No. 2014-144426 (with translation).

* cited by examiner

*Primary Examiner* — Adam Tissot
(74) *Attorney, Agent, or Firm* — Harness, Dickey & Pierce, P.L.C.

(57) ABSTRACT

A restart section in an electric powered vehicle restarts a controller from a sleep mode, when a voltage higher than a restart voltage is supplied for over a response time. In a charge mode, a stand controller provides a connection check function by using a normal CPLT (Control Pilot signal) method. In a normal CPLT method, an output terminal is supplied with DC voltage that exceeds the restart voltage. In a non-charge mode, the stand controller uses a monitor signal which will not cause a restart of the controller to provide a connection check function. The monitor signal for the non-charge mode has a voltage that is lower than the restart voltage and/or a pulse width that is shorter than the response time. As a result, it is possible to reduce power consumption.

20 Claims, 8 Drawing Sheets

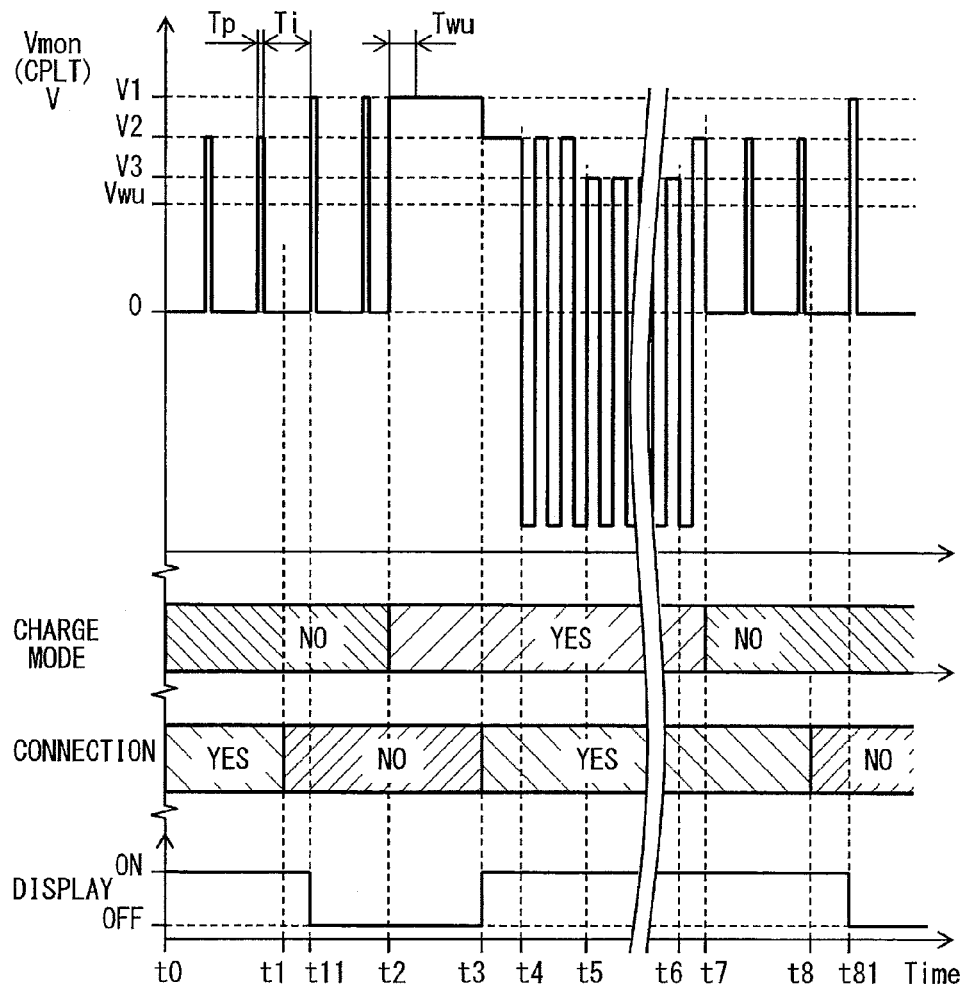

ELECTRIC POWER SUPPLY CONTROLLER FOR VEHICLE

CROSS REFERENCE TO RELATED APPLICATION

This application is based on Japanese Patent Applications No. 2013-195859 filed on Sep. 20, 2013 and No. 2014-144426 filed on Jul. 14, 2014, the disclosure of which is incorporated herein by reference.

TECHNICAL FIELD

The present disclosure relates to an electric power supply controller for vehicle.

BACKGROUND

JP2009-171733A discloses an electric powered vehicle which has a battery chargeable from an external power supply and a charging device for charging the battery. The charging device provides an electric power supply controller for vehicle. This device has a connection check function which checks and confirms physical connection between the charging device and the vehicle.

The connection check function may be provided by supplying a monitor signal to a signal line disposed in a connection cable. In one example, a charging device supplies a monitor signal to a signal line. Impedance in a circuit including the signal line would change responsive to a connection state or a non-connection state. The charging device detects change of impedance based on change of the monitor signal.

For example, a monitor signal with a predetermined voltage is supplied as a monitor signal. Voltage on the signal line is changed in response to change of impedance in the circuit containing the signal line which reflects whether the cable is in the non-connection state, or is in the connection state. The charging device may check and confirm connection by detecting the voltage on the signal line. The charging device supplies the predetermined voltage to the signal line when the charging device is ready to supply power. The charging device does not supply the predetermined voltage to the signal line when the charging device does not supply power. Such a connection check function is known, for example as a CPLT method (Control Pilot signal method.)

SUMMARY

According to the conventional technology, when the charging device is in a mode ready to supply power, that is, the charging device is in a charge mode, the predetermined voltage is supplied to the signal line. Contrary, when the charging device cannot supply power, e.g., in a non-charge mode, such as a waiting state, it is impossible to check connection.

In another aspect, a controller on the vehicle is restarted or rebooted in response to a supply of the predetermined voltage on the signal line. For example, as the voltage on the signal line reaches to the predetermined voltage, the controller on the vehicle will perform a wake up action, i.e., a restart, from a low-power-consumption state, such as a sleep mode, and will transition to a normal operating state. If such starting is repeated frequently, the power consumption of the controller on the vehicle will become large.

In the above-mentioned viewpoint, or in the other viewpoint not mentioned above, further improvement the electric power supply controller for vehicle is still required.

It is an object of the present disclosure to provide an electric power supply controller for vehicle which can check connection during the non-charge mode.

It is another object of the present disclosure to provide an electric power supply controller for vehicle which can check connection by using a small power during the non-charge mode.

It is still another object of the present disclosure to provide an electric power supply controller for vehicle which can check connection without restarting a controller on the vehicle during the non-charge mode.

The present disclosure employs the following technical means, in order to attain the above-mentioned object. One of the disclosures provides an electric power supply controller for vehicle which charges from a charging device to a battery on an electric powered vehicle. The controller comprises a signal line disposed in a connection device which electrically connects the charging device and the battery, and impedance on the signal line being changed corresponding to a connection state and a non-connection state of the connection device. The controller comprises a first connection check section which determines the connection state or the non-connection state by monitoring impedance on the signal line while supplying a predetermined first monitor signal to the signal line; a second connection check section which determines the connection state or the non-connection state by monitoring impedance on the signal line while supplying a second monitor signal with less electric power than the first monitor signal to the signal line; and a choosing section which chooses one of the first connection check section and the second connection check section.

According to this structure, a connection check using the first monitor signal and a connection check using the second monitor signal are provided. The second monitor signal has electric power smaller than the first monitor signal. On the contrary, the first monitor signal has electric power larger than the second monitor signal. Accordingly, secure connection check can be provided by the first monitor signal. On the other hand, it is possible to provide a connection check with less power consumption by using the second monitor signal. The controller can chose one of the connection check using the first monitor signals and the connection check using the second monitor signal. Accordingly, it is possible to have advantage acquired by using the first monitor signal and advantage acquired by using the second monitor signal according to various requirements.

BRIEF DESCRIPTION OF THE DRAWINGS

The above and other objects, features and advantages of the present disclosure will become more apparent from the following detailed description made with reference to the accompanying drawings. In the drawings:

FIG. 8 is a waveform diagram showing operations of the third embodiment.

DETAILED DESCRIPTION

Referring to drawings, embodiments of the present disclosure will be described hereinafter. In the embodiments, the same parts and components as those in each embodiment are indicated with the same reference numbers and the same descriptions will not be reiterated. Components and parts corresponding to the components and parts described in the preceding description may be indicated by the same reference number and may not be described redundantly. In a case that only a part of component or part is described, other descriptions for the other embodiment may be referenced or incorporated as descriptions for the remaining part of component or part.

(First Embodiment)

Figure 1:
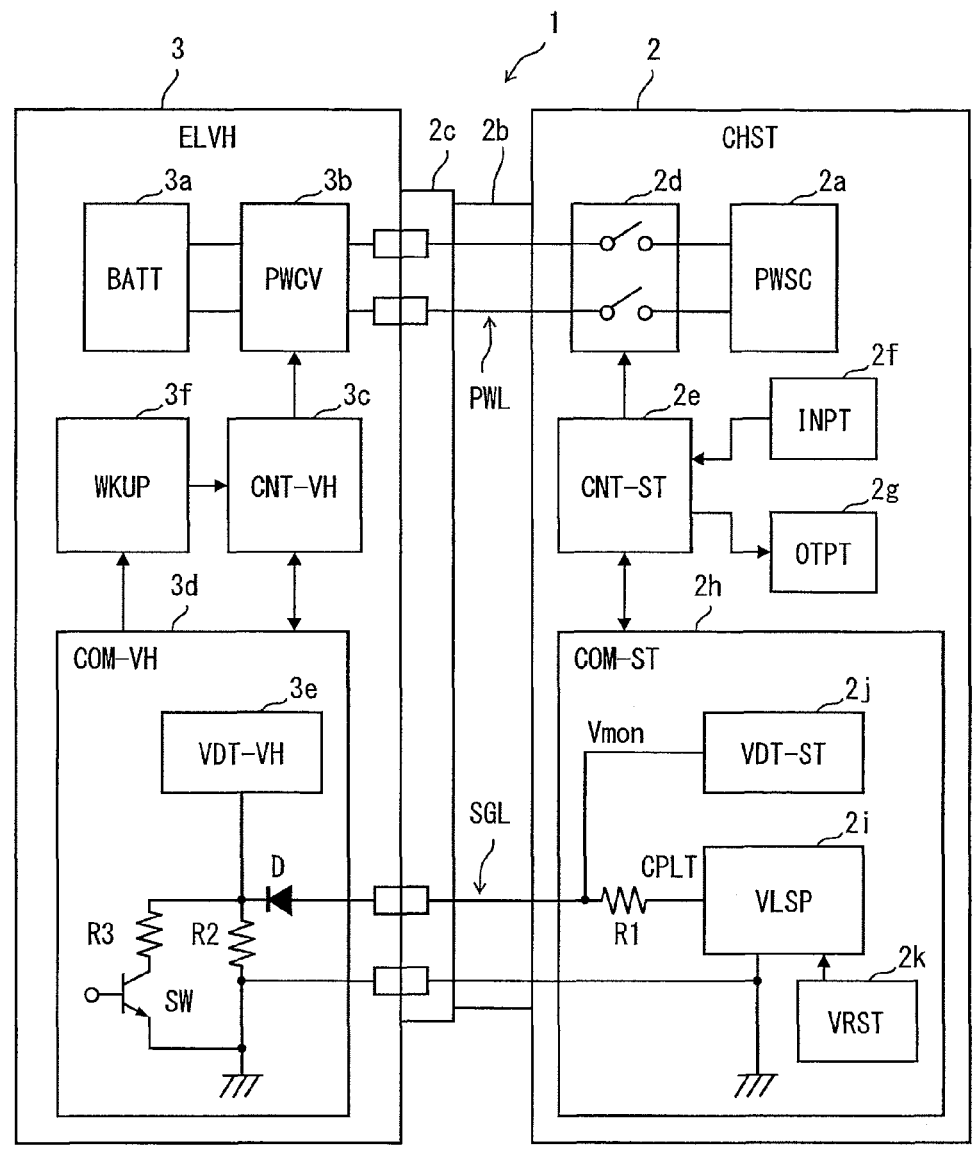
FIG. 1 is a block diagram showing an electric powered vehicle system according to a first embodiment of the present disclosure.

Referring to FIG. 1, the electric powered vehicle system 1 has a charge stand (CHST) 2 which is a charge facility, and an electric powered vehicle (ELVH) 3. The charge stand 2 is installed on a residence or a business place. The charge stand 2 provides a charging device for vehicles. ELVH 3 has at least a battery and an electric motor. ELVH 3 can be driven by activating the electric motor with electric power from the battery. ELVH 3 may be a full electric vehicle which is not equipped with a combustion engine, or a plug-in type hybrid vehicle which has a combustion engine.

The charge stand 2 is constituted to supply electric power supplied from the power source (PWSC) 2a to ELVH 3. The power source 2a may be provided by a regional power grid and/or a local area power grid. The local power grid may have a small-scale generator, a local area battery, a solar power generation device, etc. The charge stand 2 may have a cable 2b extending from the charge stand 2 and a connector 2c disposed on a distal end of the cable 2b. The cable 2b and the connector 2c electrically connect the charge stand 2 which is a charging device and a battery 3a on ELVH 3. The cable 2b and the connector 2c have a power line PWL for an electric power supply, and a signal line SGL for data communication. The connector 2c is configured to be selectively connectable with an inlet disposed on ELVH 3. An operator, e.g., a user, can operate the cable 2b and the connector 2c. The cable 2b and the connector 2c can be connected to ELVH 3 by the operator. The cable 2b and the connector 2c can be disconnected from ELVH 3 by the operator.

The charge stand 2 has a cutoff switch 2d. The cutoff switch 2d is disposed on the power line PWL, and opens and closes the power line PWL. The cutoff switch 2d may have a function as an excess current breaker and/or an earth leakage breaker.

The charge stand 2 has a stand controller (CNT-ST) 2e. The charge stand 2 has an input section (INPT) 2f. The charge stand 2 has an output section (OTPT) 2g. The charge stand 2 has a stand communication section (COM-ST) 2h. All or some of these sections disposed on the charge stand 2 provide an electric power supply controller for vehicle. The electric power supply controller for vehicle charges the battery 3a from the charge stand 2 which is a charging device.

The stand controller 2e may turns on and turns off electric power supply from the power source 2a to ELVH 3 by controlling the cutoff switch 2d. The stand controller 2e performs communication with ELVH 3 by controlling the stand communication section 2h.

The stand controller 2e inputs a signal indicative of whether it is in a charge mode or a non-charge mode from the input section 2f. The charge mode is an operation mode in which the charge stand 2 can supply power to ELVH 3. Therefore, when it is in the charge mode, if the connector 2c is connected to ELVH 3, the stand controller 2e performs control for supplying electric power to ELVH 3. For example, the charge mode may include a preparatory state before a connection, and a post-charge state after a connection, and a performing state during power supply. The non-charge mode is an operation mode in which the charge stand 2 cannot supply power to ELVH 3. Therefore, when it is in the non-charge mode, the stand controller 2e does not carry out the electric power supply to ELVH 3, even if the connector 2c is connected to ELVH 3. For example, the non-charge mode may include a state where an operator who wants to use the charge stand 2 is not there, and a waiting state in which the system is waiting to perform charging at a predetermined time range.

The charge mode may also be referred to as a power-on mode in which power supply via the power line PWL between ELVH 3 and the charge stand 2 is performed. In a case that electric power supply from ELVH 3 to the charge stand 2, i.e., the adverse current, is permitted, the power-on mode may include a discharge mode by which electric power supply from ELVH 3 to the charge stand 2 is performed. Therefore, the power-on mode may include the discharge mode and the charge mode by which electric power supply from the charge stand 2 to ELVH 3 is performed.

The non-charge mode may also be referred to as a power-off mode in which power supply using the power line PWL between ELVH 3 and the charge stand 2 is not performed. In a case that electric power supply from ELVH 3 to the charge stand 2, i.e., the adverse current, is permitted, the power-off mode may include a non-discharge mode by which electric power supply from ELVH 3 to the charge stand 2 is not performed. Therefore, the power-off mode may include the non-discharge mode and a non-charge mode by which electric power supply from the charge stand 2 to ELVH 3 is not performed.

The stand controller 2e outputs a signal which shows whether it is in a connection state or it is in a non-connection state to the output section 2g. The connection state is a state where the connector 2c is connected to ELVH 3. The non-connection state is a state where the connector 2c is not connected to ELVH 3. The stand controller 2e distinguishes and determines the connection state and the non-connection state based on the signal acquired from the stand communication section 2h. The stand controller 2e distinguishes and determines the connection state and the non-connection state based on a voltage observed on the signal line SGL.

The stand controller 2e distinguishes and determines the connection state and the non-connection state by using a CPLT method (Control Pilot signal method) when it is in the charge mode. In the CPLT method, a monitor signal which is called a CPLT monitor signal or a first monitor signal is used. The stand controller 2e distinguishes and determines the connection state and the non-connection state by using another method different from the CPLT method, when it is in the non-charge mode. In this another method, a monitor signal called a supplemental monitor signal or a second monitor signal is used. The CPLT monitor signal and the supplemental monitor signal have different electrical properties respectively. The CPLT monitor signal and the supplemental monitor signal may have a remarkable difference in voltage values and/or pulse widths. In one example, voltage values and/or pulse widths of the supplemental monitor signal are smaller than that of the CPLT monitor signal. An amount of power consumption in the charge stand 2 when the supplemental monitor signal is used is less than a power consumption in the charge stand 2 when the CPLT monitor signal is used. Additionally, power consumption in ELVH 3 when the supplemental monitor signal is used may be less than power consumption in ELVH 3 when the CPLT monitor signal is used.

The input section 2f switches operational modes between the charge mode and the non-charge mode. The input section 2f supplies a signal indicative of the charge mode or the non-charge mode to the stand controller 2e. Thereby, the stand controller 2e acquires information indicative of about whether it is in the charge mode or the non-charge mode. The input section 2f may be provided by a selector switch operated by the operator. Alternatively, the input section 2f may be provided by a controller which controls a permission and prohibition of charge by the charge stand 2. For example, the input section 2f may be provided by a controller providing a function of timer charge which permits charging to ELVH 3 from the charge stand 2 in a time zone when a certain advantage is acquired, or a fee collection controller.

The output section 2g is a device using the information provided from the stand controller 2e. The output section 2g uses the information indicative of states of the connector 2c provided from the stand controller 2e. The output section 2g acquires the information indicative of whether it is in the connection state or the non-connection state from the stand controller 2e. The output section 2g is provided by an indicator to display whether it is in the connection state or the non-connection state. The output section 2g indicates the connection state or the non-connection state in both the charge mode and the non-charge mode. Thereby, the operator can know the state of the connector 2c easily.

The output section 2g may be provided by a device which uses the information or the signal indicative of states of the connector 2c. For example, the output section 2g may be provided by a device which transmits a signal indicative of the connection state or the non-connection state to a user's mobile terminal. For example, the output section 2g may be provided by a device which arranges a schedule for power supply to ELVH 3 and performs the schedule. Alternatively, the output section 2g may be provided by a device which arranges a schedule for power supply from ELVH 3 to the charge stand 2, i.e., the reverse power supply, and performs the schedule.

The output section 2g or an external device which receives a signal from the output section 2g may use the information or the signal indicative of the state of the connector 2c in various applications. In the above-mentioned arrangement to arrange the schedule, the state of the connector 2c can be used for monitoring and storing records of connection by operators. For example, in a period indicative of a usage record of ELVH 3, such as a weekly or monthly, the state of the connector 2c can be used for identifying a specific time zone in which ELVH 3 is prone to be the connection state with high frequency and a specific time zone in which ELVH 3 is prone to be the non-connection state with high frequency. For example, the state of the connector 2c can be used for an application which changes allowance or prohibition of power supply via the power line PWL, i.e., allowance or prohibition of charging or discharging for ELVH 3. The state of the connector 2c can be used for arranging a start time and/or a finish time of power supply in an anticipatory manner. The state of the connector 2c can be used for arranging a start time and/or a finish time of reverse power supply from ELVH 3 to the charge stand 2 in an anticipatory manner.

The stand communication section 2h may provide a connection check function by the CPLT method. The stand communication section 2h has a monitor signal source (VLSP) 2i, a voltage detecting section (VDT-ST) 2j, and a signal setting section (VRST) 2k. The stand communication section 2h has a circuit for outputting a signal to the signal line SGL. In the drawing, a resistor R1 is illustrated between the monitor signal source 2i and the signal line SGL.

The monitor signal source 2i has an output terminal CPLT. The resistor R1 is connected to the output terminal CPLT in series. The monitor signal source 2i can adjust a value of voltage outputted to the output terminal CPLT and/or duration of the voltage outputted to the output terminal CPLT. The monitor signal source 2i, in a case of outputting voltage in a pulse shape to the output terminal CPLT, can adjust a pulse width and pulse spacing.

The monitor signal source 2i can selectively output one of the first monitor signal and the second monitor signal. In this embodiment, the first monitor signal is characterized with a first voltage. The second monitor signal is characterized with the second voltage. The monitor signal source 2i can output the predetermined first voltage which is used for a general CPLT method, and the second voltage lower enough than the first voltage. The first voltage is 12V, for example. The second voltage is 3V, for example. The monitor signal source 2i can output the first voltage and/or the second voltage continuously. Therefore, the second monitor signal has the second voltage lower than the first voltage of the first monitor signal.

The second voltage is a voltage in a level which does not restart the controller on ELVH 3. The first monitor signal has the first voltage which is larger than a predetermined restart voltage Vwu by which the controller on ELVH 3 is restarted. The second monitor signal has the second voltage which is smaller than the restart voltage Vwu.

Furthermore, the monitor signal source 2i can output the first voltage and/or the second voltage as a pulse, i.e., a short-time impulse wave. The monitor signal source 2i can output the first voltage and/or the second voltage over a period long enough for restarting the controller on ELVH 3. The monitor signal source 2i can output the first voltage and/or the second voltage only for a short period of time which is short enough for not restarting the controller on ELVH 3.

The monitor signal source 2i is also an oscillator which can adjust a duty ratio. The stand controller 2e oscillates the output of the monitor signal source 2i by a predetermined duty ratio, in order to transmit a current value which can be used for charging the battery 3a in ELVH 3. This duty ratio may show the current value. For example, a signal of duty ratios, such as 1 kHz, 3 to 7%, and 8 to 97%, may be outputted.

The voltage detecting section 2j detects a voltage Vmon which appears between the resistor R1 and the signal line SGL. The voltage Vmon is also called a detection voltage or a monitor voltage. The voltage Vmon changes corresponding to the state of the connector 2c. When the connector 2c is in the non-connection state, the voltage Vmon is equal to the output voltage of the monitor signal source 2i. When the connector 2c is in the connection state, according to the impedance of the circuit of ELVH 3, the voltage Vmon descends lower than the output voltage of the monitor signal source 2i. Therefore, when the voltage Vmon is higher than a predetermined threshold value, it can be determined that it is in the non-connection state. When the voltage Vmon is lower than a predetermined threshold value, it can be determined that it is in the connection state. Thus, the connection state and the non-connection state can be distinguished based on the voltage Vmon.

The stand controller 2e adjusts the voltage and/or the period of signal applied to the signal line SGL by controlling the monitor signal source 2i. The stand controller 2e determines that it is in the connection state or the non-connection state by inputting the voltage Vmon from the voltage detecting section 2j. The stand controller 2e controls the cutoff switch 2d based on the information acquired from the stand communication section 2h. For example, the stand controller 2e controls the cutoff switch 2d in a closed state or an open state according to the connection or the non-connection between the connector 2c and ELVH 3. For example, the stand controller 2e switches the cutoff switch 2d to the open condition from the closed state in response to a completion of charge. The stand controller 2e outputs the signal indicative of the connection state and the non-connection state to the output section 2g based on the information acquired from the stand communication section 2h.

The signal setting section 2k sets up an electric property of the monitor signal to be supplied to the signal line SGL from the monitor signal source 2i. Here, the signal setting section 2k is configured to adjust variables such as a voltage and/or a time period of the monitor signal, and sets the variables.

In the illustrated structure, the electric power supply controller for vehicle is provided by the devices including the stand controller 2e and the stand communication section 2h.

ELVH 3 has a battery (BATT) 3a. The battery 3a supplies electric power to the electric motor for driving ELVH 3. The battery 3a may be provided by a lithium ion battery. ELVH 3 has an electric power converter (PWCV) 3b. The electric power converter 3b transforms the electric power supplied from the charge stand 2 into the electric power which can charge the battery 3a. The electric power converter 3b can include an inverter circuit and a converter circuit.

ELVH 3 has a vehicle controller (CNT-VH) 3c. ELVH 3 has a vehicle communication section (COM-VH) 3d. ELVH 3 has a restart section (WKUP) 3e.

The vehicle controller 3c controls the electric power converter 3b. The vehicle controller 3c controls the electric power converter 3b based on information acquired from the vehicle communication section 3d. The vehicle controller 3c transmits charge relating information to the charge stand 2 via the signal line SGL by controlling the vehicle communication section 3d. Charge condition of the battery 3a and/or control state of the electric power converter 3b can be included in the charge relating information. The charge relating information may include information about a charge operation to the battery 3a is progressing, and about a completion of the charge operation to the battery 3a.

The vehicle communication section 3d has a circuit which modulates the voltage supplied from the signal line SGL. In the drawing, the circuit which changes the voltage drop of the signal supplied to the signal line SGL in a multi-stage manner, i.e., in a two steps manner is illustrated. In the drawing, a parallel circuit of a circuit which grounds the signal line SGL via a resistor R2 and a circuit which grounds the signal line SGL by a resistor R3 and a switch element SW is illustrated. A diode D for preventing reverse current is illustrated. The switch element SW is controlled by the vehicle controller 3c. An impedance of the signal line SGL may be varied by this circuit in accordance with the connection state and non-connection state of the connection device.

The vehicle communication section 3d has a voltage detecting section (VDT-VH) 3e. The voltage detecting section 3e detects the voltage Vmon which appears on the parallel circuit of the resistors R2 and R3. The voltage Vmon changes corresponding to the state of the connector 2c. The voltage Vmon changes depending on the state of the connector 2c, and the state of the switch element SW. The voltage Vmon changes depending on the state of the connector 2c, the state of the switch element SW, and the voltage of the signal given from the charge stand 2. The voltage Vmon is zero when the connector 2c is in the non-connection state.

When the connector 2c is in the connection state, the positive predetermined voltage applied from the charge stand 2 is divided by a first divider circuit having the resistor R1, the diode D, and the resistor R2. In this case, the voltage corresponding to a voltage drop on the resistor R2 is observed as the voltage Vmon for determination. The voltage Vmon depends on the voltage of the signal applied from the charge stand 2 and a voltage dividing ratio of the divider circuit. When the connector 2c is in the non-connection state, according to the impedance of the circuit of ELVH 3, the voltage Vmon descends lower than the output voltage of the monitor signal source 2i. Therefore, when the voltage Vmon is higher than a predetermined threshold value, it can be determined that it is in the non-connection state. When the voltage Vmon is lower than the predetermined threshold value, it can be determined that it is in the non-connection state. Thus, the connection state and the non-connection state can be distinguished based on the voltage Vmon.

The vehicle controller 3c opens the switch element SW continuously during the period in which a preparation for charging the battery 3a has not completed, or the period in which a charging the battery 3a is not performed. In these periods, the connection state and the non-connection state of the connector 2c are distinguished and determined based on the voltage Vmon generated by the first divider circuit. Since the voltage Vmon during the switch element SW is open is observed also in the charge stand 2, it is detectable also in the charge stand 2 that a charging to the battery 3a on ELVH 3 is not performed, it is in a period for preparing a charging, or it is after the charging is completed.

The vehicle controller 3c closes the switch element SW to change the voltage dividing ratio of the circuit containing the signal line SGL, if the preparative measure for charging to the battery 3a is completed. The vehicle controller 3c closes the switch element SW continuously during a period in which the charging to the battery 3a is performed. Thereby, the voltage Vmon on the signal line SGL falls.

When the connector 2c is in the connection state, the positive predetermined voltage applied from the charge stand 2 is divided by a second divider circuit having the resistor R1, the diode D, the resistor R2 the switch element SW and the resistor R3. In this case, the voltage corresponding to a voltage drop on the resistor R2, the resistor R3 and the switch element SW is observed as the voltage Vmon for determination.

Since lowering of the voltage Vmon caused by turning on the switch element SW is observed also in the charge stand 2, it is detectable also in the charge stand 2 that a charging to the battery 3a on ELVH 3 is being performed. The vehicle controller 3c determines a current value which can be charged based on the duty ratio of the signal which appears on the signal line SGL. The vehicle controller 3c controls the electric power converter 3b based on the current value which can be charged.

The restart section 3f restarts the controller including the vehicle controller 3c on ELVH 3 in response to the voltage Vmon detected by the voltage detecting section 3e. For example, when ELVH 3 is placed on parking condition, the controller including the vehicle controller 3c is placed on a sleeping state with small power consumption. When ELVH 3 is in the parking condition and the battery 3a is charged, the controller including the vehicle controller 3c is restarted from the sleeping state to a usual operating state. Such a restart operation is called as a wake-up operation. The restart section 3f restarts the controller including the vehicle controller 3c, when the voltage exceeding a predetermined restart voltage Vwu is continuously detected by the voltage detecting section 3e over a long period of time exceeding a predetermined response time Twu. For example, the restart section 3f restarts the vehicle controller 3c, when the voltage Vmon detected by the voltage detecting section 3e exceeds 6V continuously over the period exceeding 100 microseconds.

The stand controller 2e provides a controller for the charge stand 2. The vehicle controller 3c provides a controller for ELVH 3. The controllers are electronic control units. The controller has at least one processing unit (CPU) and at least one memory (MMR) as a storage medium which stores and memorizes a program and data. The controller is provided by a microcomputer which has a storage medium which can be read by computer. The storage medium is a non-transitory storage medium which stores a program readable by the computer. The storage medium may be provided with semiconductor memory or a magnetic disc. The controller may be provided with a computer or a set of computer resources linked by a data communication device. The program, when the controller executes the program, makes the controller to function as the apparatus described in this specification, and makes the controller to function to perform methods, such as control method, described in this specification. The controller provides various components. At least a part of the components may be referred to as means for performing function, and from the other viewpoint, at least a part of the components may be referred to as compositional block or module.

The signal setting section 2k sets up an electrical property of the first monitor signal and/or the second monitor signal so that the first monitor signal has a predetermined electrical property by which the controller on ELVH 3 is restarted, and the second monitor signal does not have the predetermined electrical property. In other words, the second monitor signal has an electrical property by which the controller on ELVH 3 is not restarted. According to this structure, the electrical properly of the first monitor signal and/or the second monitor signal can be set up to surely perform a waking up restart by the first monitor signal, and to surely prevent the waking up restart by the second monitor signal. The electrical property may be set by adjusting voltage and/or pulse width. The value of voltage and/or pulse width of voltage of the monitor signal may be set according to a specification of the charge stand 2, a specification of ELVH 3, a utilization environment of the electric powered vehicle system 1, etc. For example, the voltage V1 and voltage V4 outputted as the monitor signal can be set according to a type of ELVH 3, etc. The pulse width Tp of the monitor signal can be set according to a type of ELVH 3, etc. These voltage and/or pulse width can be set as a value which can realize a stable action under an external noise assumed in the utilization environment. The voltage and/or pulse width may be set in an automatic manner or in a manually selective manner.

Figure 2:
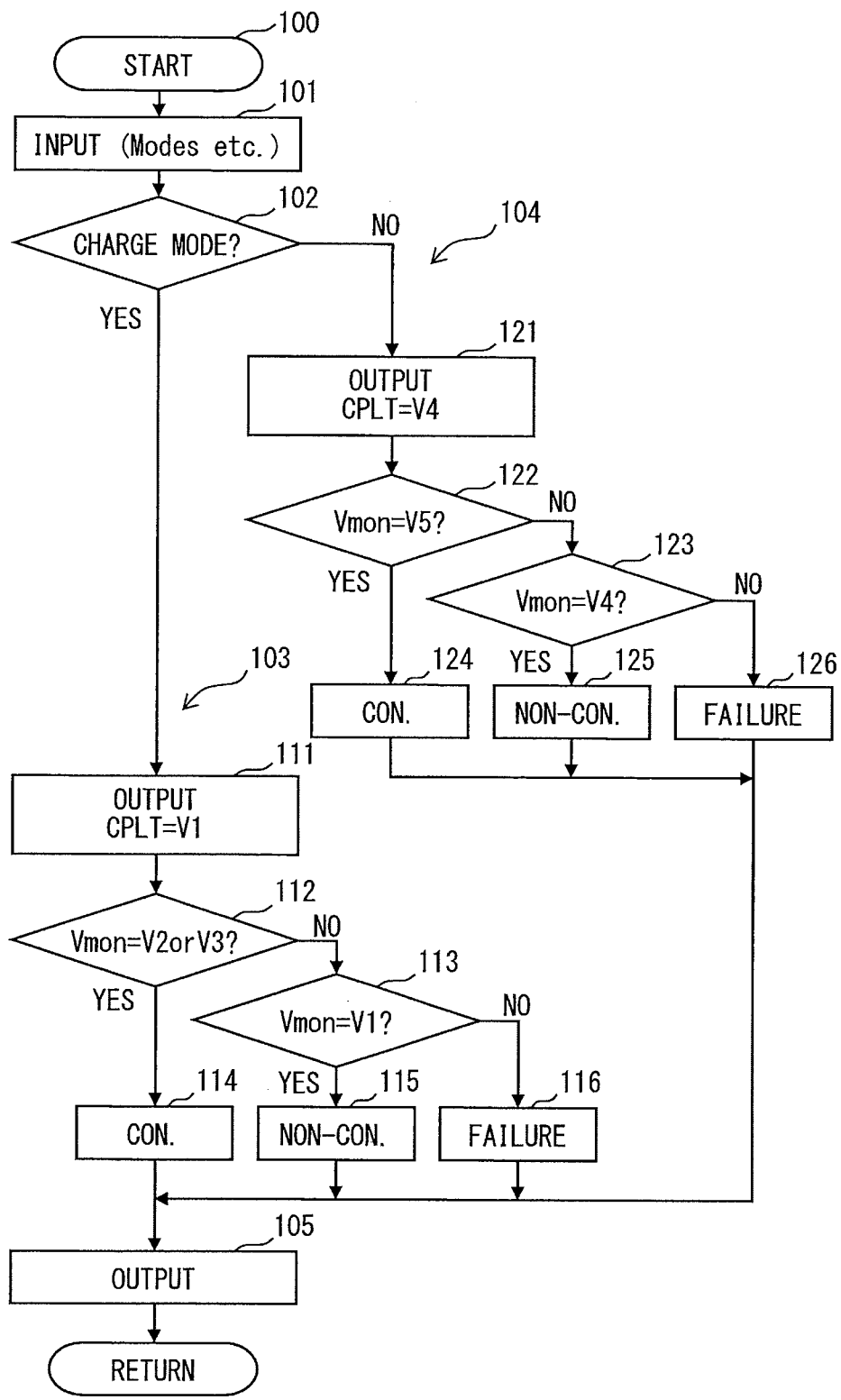
FIG. 2 is a flow chart showing a process in the first embodiment.

FIG. 2 is a flowchart showing a control operation performed in the stand controller 2e. A process 100 for checking or confirming connection between the connector 2c and ELVH 3 is illustrated. In step 101, a set of data necessary for performing the control operation is inputted. For example, the stand controller 2e inputs the data which shows that whether it is in the charge mode or the non-charge mode from the input section 2f.

In step 102, it is determined that whether it is in the charge mode. When it is in the charge mode, the routine branches to YES and progresses to a step group 103. In the step group 103, connection check using a normal CPLT method is performed. The step group 103 provides a connection check process in the charge mode. On the other hand, when it is not the charge mode, i.e., when it is in the non-charge mode, the routine branches to NO and progresses to a step group 104. In the step group 104, connection check using a signal which is not used is the normal CPLT method is performed. Step group 104 provides a connection check process in the non-charge mode.

The step group 103 provides a first connection check section which determines the connection state or the non-connection state by monitoring impedance on the signal line SGL while supplying a predetermined first monitor signal to the signal line SGL. The step group 104 provides a second connection check section which determines the connection state or the non-connection state by monitoring impedance on the signal line SGL while supplying a second monitor signal with less electric power than the first monitor signal to the signal line SGL. Step 101 and step 102 provides a choosing section which chooses one of the first connection check section and the second connection check section. The first connection check section and the second connection check section monitors impedance on the signal line SGL by monitoring a voltage Vmon appears on the signal line SGL by supplying the monitor signal.

The routine reaches to step 105 after taking the step group 103 or the step group 104. In step 105, the result obtained in the above-mentioned connection check process is outputted. For example, the stand controller 2e outputs a set of data in which it is shown whether it is in the connection state or the non-connection state to the output section 2g. Thereby, the output section 2g displays to an operator about whether it is in the connection state or the non-connection state.

In the step group 103, steps 111-116 are performed. In step 111, the monitor signal is outputted to the signal line SGL by the monitor signal source 2i. The monitor signal is a signal used in the normal CPLT method. The monitor signal is characterized by a voltage V1 continuously applied. As a result, the voltage V1 is outputted continuously to the output terminal CPLT.

In step 112 and step 113, the voltage Vmon detected by the voltage detecting section 2j is evaluated. When the voltage Vmon is equal to the voltage V2 or is equal to the voltage V3 (Vmon=V2 or Vmon=V3) indicative of the connection state, the routine progresses to step 114 from step 112. In step 114, the connection state is determined. When the voltage Vmon is equal to the voltage V1 (Vmon=V1) indicative of the non-connection state, the routine progresses to step 115 via step 113 from step 112. In step 115, the non-connection state is determined.

In a case that the voltage Vmon is not equal to any one of V1, V2, and V3, the routine progresses to step 116 from step 113. In step 116, a failure of the stand communication section 2h is determined. Step 113 and step 116 provide an abnormality determining section which determines an abnormality of the stand communication section 2h based on the voltage Vmon. Step 113 and Step 116 provide an abnormality determining section which determines an abnormality of the circuit based on the first monitor signal.

In the step group 104, steps 121-126 are performed. In step 121, the monitor signal is outputted to the signal line SGL by the monitor signal source 2i. The monitor signal is a signal which is not used in the normal CPLT method and is different from signals used in the normal CPLT method. The monitor signal is characterized by a voltage V4 continuously applied. As a result, the voltage V4 is outputted continuously to the output terminal CPLT. The voltage V4 is lower than the above-mentioned voltages V1, V2, and V3. The voltage V4 is lower than the restart voltage Vwu by which the vehicle control section 3c is started.

In step 122 and step 123, the voltage Vmon detected by the voltage detecting section 2j is evaluated. When the voltage Vmon is equal to a voltage V5 (Vmon=V5) indicative of the connection state, the routine progresses to step 124 from step 122. In step 124, the connection state is determined. When the voltage Vmon is equal to the voltage V4 (Vmon=V4) indicative of the non-connection state, the routine progresses to step 125 via step 123 from step 122. In step 125, the non-connection state is determined.

In a case that the voltage Vmon is not equal to any one of V1, V2, and V3, the routine progresses to step 126 from step 123. In step 126, a failure of the stand communication section 2h is determined. Step 123 and step 126 provide an abnormality determining section which determines an abnormality of the stand communication section 2h based on the voltage Vmon. Step 123 and step 126 provide an abnormality determining section which determines an abnormality of the circuit based on the second monitor signal.

Figure 3:
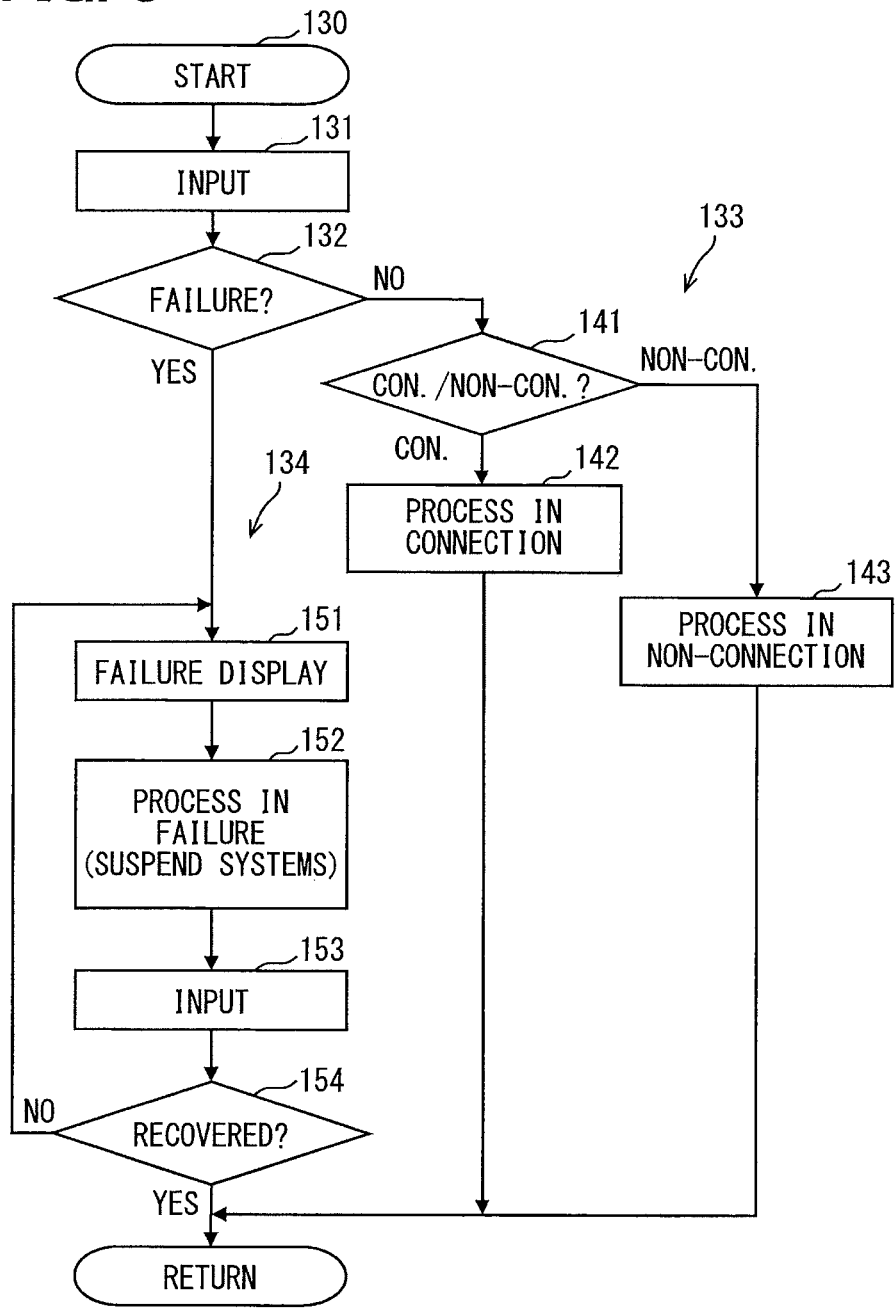
FIG. 3 is a flow chart showing a process for an output section in the first embodiment.

FIG. 3 shows the process 130 using a determined result. This process 130 is performed by the output section 2g or the external device which receives a signal from the output section 2g. In step 131, a set of data outputted in step 105 is inputted. This data shows the connection state or the non-connection state of the connector 2c, and the abnormalities of the circuit including the failure of the stand communication section 2h. In step 132, it is determined that whether a set of data shows a failure. In a case that the data shows a normal state without a failure, the routine progresses to a normal process 133. In a case that a set of data shows a failure, the routine progresses to a failure process 134.

The normal process 133 provides the control processing corresponding to the connection and non-connection states of the connector 2c. For example, in the connection state, the normal process 133 performs a charge-and-discharge operation based on a schedule in the connection state. In the non-connection state, the normal process 133 performs a warning operation or a connection suggesting operation which suggests or recommends a user to connect the connector 2c by displaying that the system is in the non-connection state. The normal process 133 may contain steps 141, 142, and 143.

In step 141, it is determined that a set of data shows whether the connection state or the non-connection state. In a case that the data shows the connection state, the routine progresses to step 142. In a case that the data shows the non-connection state, the routine progresses to step 143.

In step 142, a process for the connection state is performed. Here, the charge operation or the discharge operation for ELVH 3 may be performed. Additionally or alternatively, a process for displaying information about the connection state of the connector 2c to a user may be performed.

In step 143, a process for the non-connection state is performed. Here, a process for displaying information about the non-connection state of the connector 2c to a user may be performed. Additionally or alternatively, a process for controlling devices and/or functions available in the connection state of the connector 2c to a suspended or deactivated condition may be performed. This process enables to reduce power consumption of the charge stand 2 and/or the external device.

The failure process 134 may also be referred to as an abnormal process. The failure process 134 provides a process for recommending a user to take measure to recover from the failure or a failsafe process. For example, the failure process 134 displays information about the failure and suspends at least a part of function of a device and/or a system using the data. Furthermore, the failure process 134 enables automatic recovery to the normal process 133 when the failure is solved. The failure process 134 provides an anti-abnormality measure section which performs a measure against the abnormality if the abnormality is determined in the abnormality determining section. The failure process 134 may contain steps 151, 152, 153, and 154.

In step 151, the system displays information about the failure to the user. In step 152, a process corresponding to a failure state is performed. In step 152, at least a part of function of the device and/or the system using the data is suspended. This process enables reduction of power consumption on the charge stand 2 and/or the external device. For example, in a case that the charge stand 2 is installed in a residence, at least a part of the function of the home energy management systems is suspended in step 152. For example, in step 152, the charge function and/or discharge function for ELVH 3 is suspended. In addition, power supply to devices relevant to those functions is stopped. Step 151 and step 152 provide a measure against the abnormality which takes care of the failure.

In step 153, the data outputted in step 105 is inputted again after step 151 and step 152. That is, a set of data is inputted again after the failure is determined.

In step 154, it is determined that whether a set of data shows a recovery from the failure to the normal state. When the data still shows the failure and shows no recovery, the routine returns to step 151. When a set of data shows a recovery, the routine returns to step 131 and repeats the process 130. Step 153 and step 154 provide an automatic recovery process in which the system is automatically recovered from the failure to the normal process.

In this process 130, during the failure, i.e., abnormalities, is determined, the processing loop is performed repeatedly. However, the device and/or the system responsive to the connection state and the non-connection state of the connector 2c suspends at least a part of function or whole operation of itself. As a result, it is possible to reduce power consumption. Even if it is a case where the failure is determined due to noise, it is possible to perform an automatic recovery when the noise disappears. Since recovery or not is determined in step 154 of the process 130, it is possible to set a recovery condition at a device which performs the process 130. For example, a home energy management system, e.g., the external device, may determine whether a failed state should be definitely affirmed or a recovery from the failed state should be tried.

Figure 4:
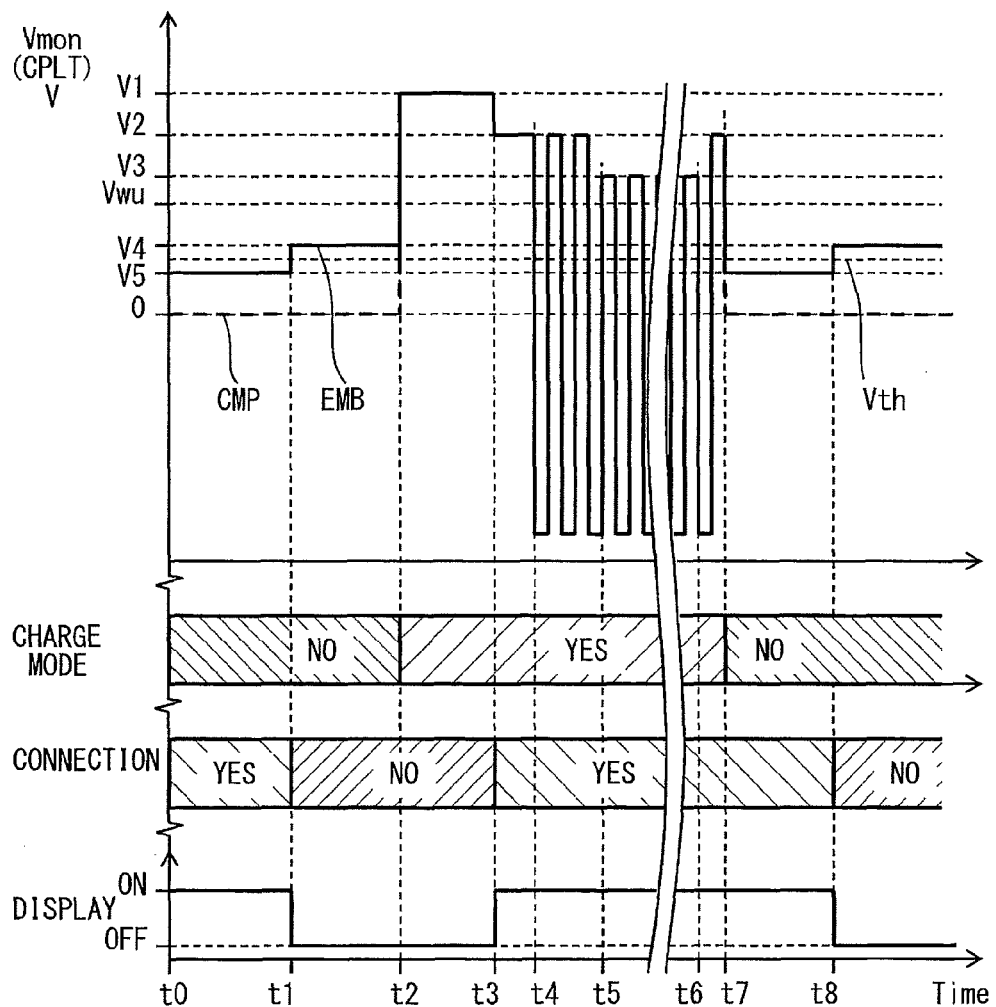
FIG. 4 is a waveform diagram showing operations of the first embodiment.

FIG. 4 is a timing diagram showing an example of operation of the electric powered vehicle system 1. In the drawing, the voltage Vmon, the charge mode or not, the connector 2c is in the connection state or not, a displaying condition on the output section 2g are illustrated from the upmost row.

Waveforms from a time t0 are illustrated. In the case of the normal CPLT method generally used in this field, the connection check function is not provided during the period of the non-charge mode. In the normal CPLT method, the voltage of the output terminal CPLT is 0V throughout the non-charge mode. In the drawing, the broken line CMP shows waveforms in the normal CPLT method. In a period t0-t2 which is the non-charge mode, and a period after a time t7, the voltage Vmon of the output terminal CPLT is 0V.

On the other hand, in this embodiment, the voltage V4 is outputted to the output terminal CPLT during the period in the non-charge mode. Accordingly, the voltage Vmon changes to V4 or V5 according to the state of the connector 2c. The solid line EMB shows a waveform by this embodiment. In the period t0-t2 and the period after t7, which are the non-charge mode, the voltage V4 is applied to the output terminal CPLT. Since a voltage drop is not produced when the connector 2c is in the non-connection state, the voltage Vmon is equal to the voltage V4. Since a voltage drop arises when the connector 2c is in the connection state, the voltage Vmon is equal to the voltage V5. The stand controller 2e identifies and discriminates the voltage V4 and the voltage V5 by using the threshold value Vth between the voltage V4 and the voltage V5. The stand controller 2e distinguishes and determines the connection state and the non-connection in the non-charge mode. The stand controller 2e determines the abnormality of the circuit by determining whether the voltage Vmon is in a predetermined range which contains both of the voltages V4 and V5.

Between a time t0 and a time t1, it is in the non-charge mode and the connection state. As a result, the voltage Vmon becomes the voltage V5 due to a voltage drop on the circuit. Although it is in the non-charge mode, the stand controller 2e detects the connection state and outputs the signal indicating the connection state to the output section 2g. As a result, the output section 2g performs a display to show the connection state by ON condition.

As it reaches to a time t1, the connector 2c is operated to the non-connection state. As a result, the voltage Vmon rises to the voltage V4 without a voltage drop. Although it is in the non-charge mode, the stand controller 2e detects the non-connection state and outputs the signal indicating the non-connection state to the output section 2g. As a result, the output section 2g performs a display to show the non-connection state by OFF condition.

The charge mode is set when it reaches to a time t2. The stand controller 2e applies the voltage V1 to the output terminal CPLT by controlling the monitor signal source 2i. Between t2 and t3, the connector 2c is in the non-connection state. Accordingly, the voltage Vmon is equal to the voltage V1.

In a time t3, the connector 2c is operated to the connection state. As a result, the voltage Vmon falls to the voltage V2 by a voltage drop. By using the normal CPLT method in the charge mode, the stand controller 2e detects the connection state and outputs the signal indicating the connection state to the output section 2g. As a result, the output section 2g performs a display to show the connection state by ON condition.

The stand controller 2e oscillates the applied voltage to the output terminal CPLT by a predetermined duty ratio from a time t4 which is after a predetermined time delay after a time t3. Then, as a preparatory process for charge in ELVH 3 is completed, in a time t5, the vehicle controller 3c closes the switch element SW. As a result, the voltage Vmon falls to the voltage V3. After a time t5, a charge process to the battery 3a is performed. Then, as the charge to the battery 3a is completed, in a time t6, the vehicle controller 3c opens the switch element SW. As a result, the voltage Vmon rises from the voltage V3 to the voltage V4. If the stand controller 2e detects an increase from the voltage V3 to the voltage V2, the stand controller 2e terminates the charge mode and transitions to the non-charge mode. As a result, the oscillation of the applied voltage to the output terminal CPLT is suspended.

After a time t7, the connection check function in the non-charge mode is provided again. Between t7 and t8, the system is in the non-charge mode and in the connection state. As a result, the voltage Vmon becomes the voltage V5 by a voltage drop on the circuit. Although the non-charge mode, the stand controller 2e detects the connection state and outputs the signal indicating the connection state to the output section 2g.

As a result, the output section 2g provides a display which shows the connection state by an ON condition.

Then, as it reaches to a time t8, the connector 2c is operated to the non-connection state. As a result, the voltage Vmon rises to the voltage V4 without a voltage drop. Although it is in the non-charge mode, the stand controller 2e detects the non-connection state and outputs the signal indicating the non-connection state to the output section 2g. As a result, the output section 2g performs a display to show the non-connection state by OFF condition.

According to this embodiment, a connection check using the first monitor signal and a connection check using the second monitor signal are provided. The second monitor signal has electric power smaller than the first monitor signal. On the contrary, the first monitor signal has electric power larger than the second monitor signal. Accordingly, secure connection check can be provided by the first monitor signal. On the other hand, it is possible to provide a connection check with less power consumption by using the second monitor signal. The controller can chose one of the connection check using the first monitor signals and the connection check using the second monitor signal. Accordingly, it is possible to have advantage acquired by using the first monitor signal and advantage acquired by using the second monitor signal according to various requirements. In this embodiment, the first voltage which characterizes the first monitor signal is the voltage V1. The second voltage which characterizes the second monitor signal is the voltage V4.

For example, the choosing section chooses the first connection check section in a charge mode for charging from the charge stand 2 to ELVH 3. The choosing section chooses the second connection check section in a non-charge mode where ELVH 3 is not charged from the charge stand 2. Thereby, also when it is in the non-charge mode, the stand controller 2e can determine whether the connector 2c and ELVH 3 are in the connection state or the connector 2c and ELVH 3 are in the non-connection state.

In other words, the choosing section chooses the first connection check section in the power-on mode where a current flow in either direction is allowed between the charge stand 2 and ELVH 3. The choosing section chooses the second connection check section in the power-off mode where no current flow is allowed between the charge stand 2 and ELVH 3. Therefore, also in the power-off mode where usage of the power line PWL is not intended, the stand controller 2e can determine whether the connector 2c and ELVH 3 are in the connection state, or the connector 2c and ELVH 3 are in the non-connection state.

The connection check function in the non-charge mode is performed by the monitor signal which does not cause restarting of the controller by the restart section 3f of ELVH 3. As a result, it is possible to reduce power consumption on ELVH 3. The monitor signal is provided by using the voltage V4 which is lower than the restart voltage Vwu at which the restart section 3f performs a restart action, i.e., a wakeup action. Accordingly, the power consumption in the charge stand 2 is reduced.

According to this embodiment, an advantageous effect can be provided in an application in which a schedule for charge or discharge during a parking period of ELVH 3 is set, and the charge and discharge of ELVH 3 is performed based on the schedule. In such an application, it is possible to perform an exact detection of the period in the connection state, for example. In another aspect, it is possible to avoid an unnecessary process. Furthermore, in another aspect, it is possible to perform a process to recommend or suggest a user a connecting operation of the connector 2c. Moreover, it is possible to determine the connection state or the non-connection state by using the signal with the predetermined voltage by the device on the charge stand 2, without using the device mounted on ELVH 3. Accordingly, it is possible to provide the above advantageous effect by the device on the the charge stand 2, without installing special circuits or process in the device mounted on ELVH 3.

(Second Embodiment)

This embodiment is one of modifications based on a basic form provided by the preceding embodiment. In the preceding embodiment, a monitor signal characterized by a continuously applied voltage is used to provide the connection check function in the non-charge mode. Alternatively, in this embodiment, a monitor signal characterized by an intermittently applied voltage is used.

Figure 5:
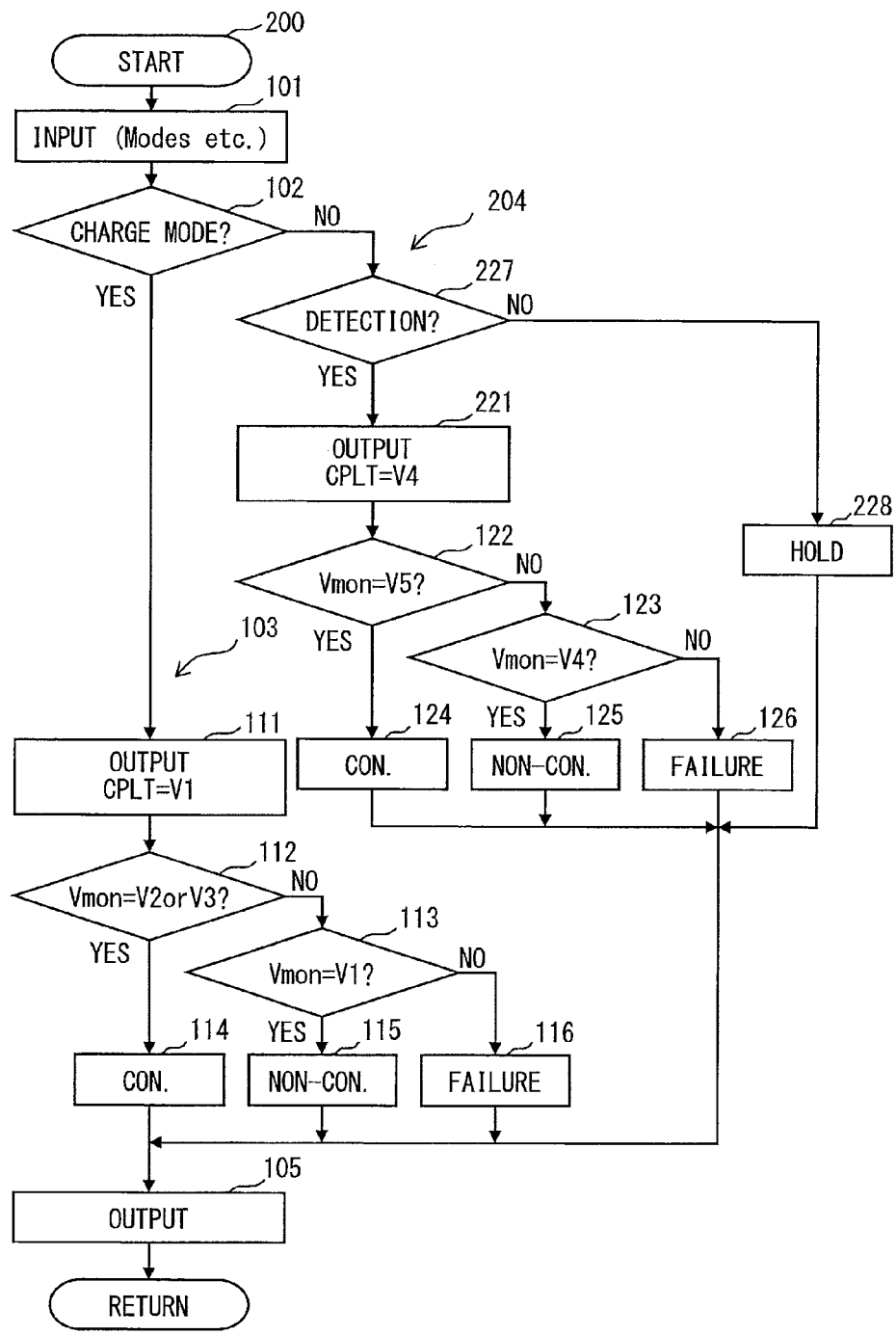
FIG. 5 is a flow chart showing a process in a second embodiment.

In this embodiment, the structure shown in FIG. 1 and described is adopted. Instead of the flowchart in FIG. 2, the flowchart of FIG. 5 is adopted. A process 200 is performed in this embodiment. The process 200 has a step group 204 instead of the step group 104. Step group 204 provides a connection check function in the non-charge mode.

In step 227, it is determined that whether a detection timing, which is predetermined intermittently, comes or not. If a detecting timing comes, the routine branches to YES and progresses to step 221. In step 221, the monitor signal is outputted to the signal line SGL by the monitor signal source 2i. The routine progresses to step 122 after performing step 221.

The monitor signal is a signal which is not used in the normal CPLT method and is different from signals used in the normal CPLT method. The monitor signal is characterized by voltage V4 with a short time pulse form. As a result, voltage V4 is outputted as a pulse form to the output terminal CPLT.

Voltage V4 is lower than the voltages V1, V2, and V3. Voltage V4 is lower than the restart voltage Vwu. The monitor signal has a pulse width Tp which is set up short enough to an interval between the detection timings.

The pulse width Tp and the interval Ti of the detection timings are set up so that power consumption can be reduced while suppressing a detection delay from a state change within a tolerance level. It is desirable that the interval Ti is set as the longest possible time, while the interval Ti still allows acquiring the information about determination of the connection state and the non-connection state with suitable frequency. For example, the interval Ti may be set as the longest time which can satisfy a requirement from a usage cycle time of the information about connection determination in the external device which uses the information. In other words, the interval Ti may be set within a range which is shorter than the usage cycle time. One example of the external device is a home energy management system which is installed in the resident where the charge stand 2 is installed. For example, the interval Ti may be set about 1 minute. Such setting contributes to reduce processing load in the stand controller 2e and power consumption. In this embodiment, the first monitor signal has a long continuous time period as a direct current continued throughout the charge mode.

In this embodiment, the second monitor signal has a pulse width Tp which is shorter than a continuous time period of the first monitor signal. The first monitor signal has a continuous time period which is longer than a predetermined response time Twu by which the controller on ELVH 3 is restarted. The pulse width Tp of the second monitor signal is shorter than the response time Twu. The pulse width Tp may be set as the shortest time period which still can filter an incorrect detection by noises, i.e., within limits which allows preventing the incorrect detection by noises. It is possible to increase reduction degree of power consumption by using the pulse width Tp which allows stopping functions other than a timer etc. In this arrangement, the second connection check section provided by the step group 204 intermittently supplies the second monitor signal to the signal line SGL.

In step 227, if it is not a detecting timing, the routine progresses to step 228. In step 228, a determined result obtained in the last cycle in step 124-126 in the previous detection timing is held. Step 228 provides a holding section which holds or maintains a previous determined result during an idle time period following a supplying time period of the second monitor signal, i.e., the interval Ti.

Figure 6:
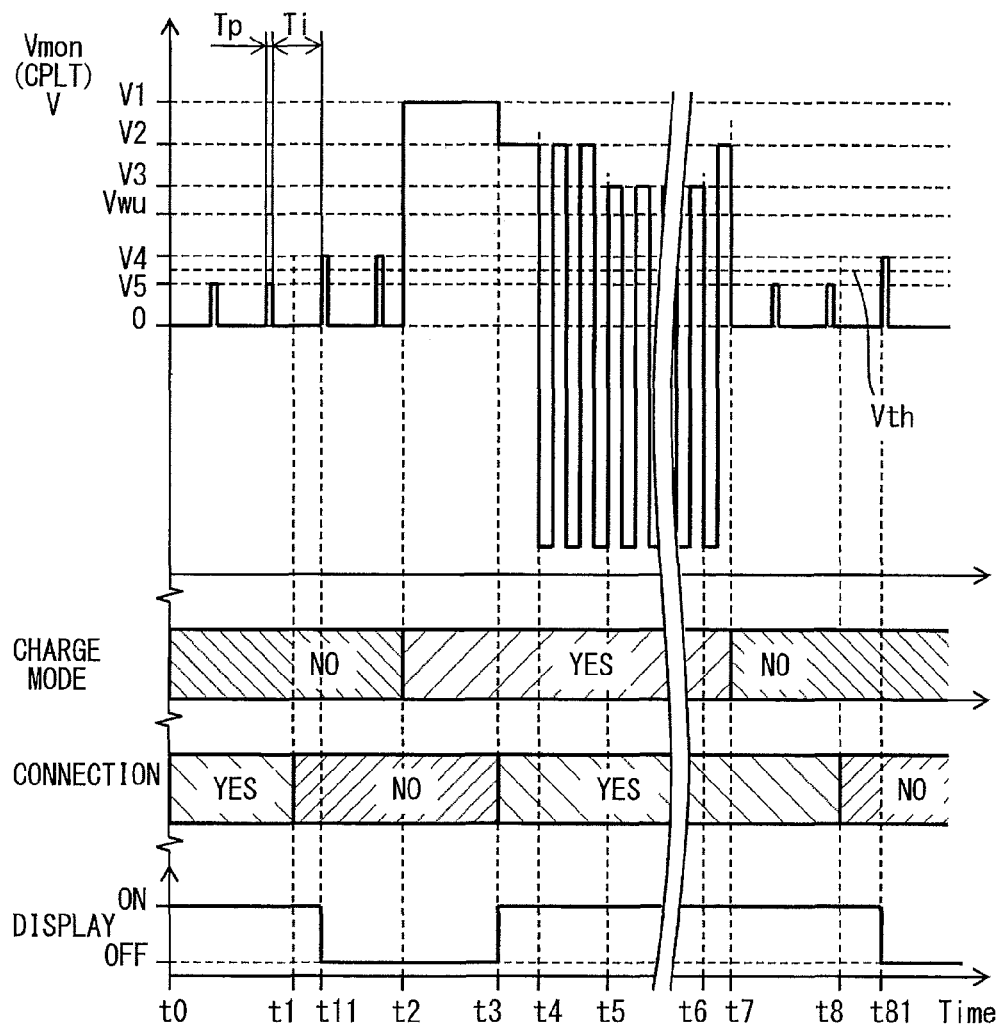
FIG. 6 is a waveform diagram showing operations of the second embodiment.

FIG. 6 is a timing diagram showing an example of operation of this embodiment. A pulse width Tp of the monitor signal and an interval Ti of the detection timings are illustrated. In this embodiment, detection timing is set up intermittently. Accordingly, a change from the connection state to the non-connection state is detected at the time t11 which is slightly late after the time t1. Similarly, a change from the connection state to the non-connection state is detected at the time t81 which is slightly late after the time t8.

According to this embodiment, in addition to the advantages of the previous embodiment, it is possible to suppress power consumption in the charge stand 2. Since the pulse width Tp is less than the response time Twu, it is surely possible to suppress power consumption when the connection check is performed by using the second monitor signal.

(Third Embodiment)

This embodiment is one of modifications based on a basic form provided by the preceding embodiment. In the preceding embodiment, the monitor signal characterized by voltage V4 and V5 lower than the restart voltage Vwu are used to provide the connection check function in the non-charge mode. Alternatively, this embodiment uses a monitor signal which impresses a pulse form voltage with a pulse width Tp shorter than the response time Twu which is necessary for the restart section 3f to start the controller.

Figure 7:
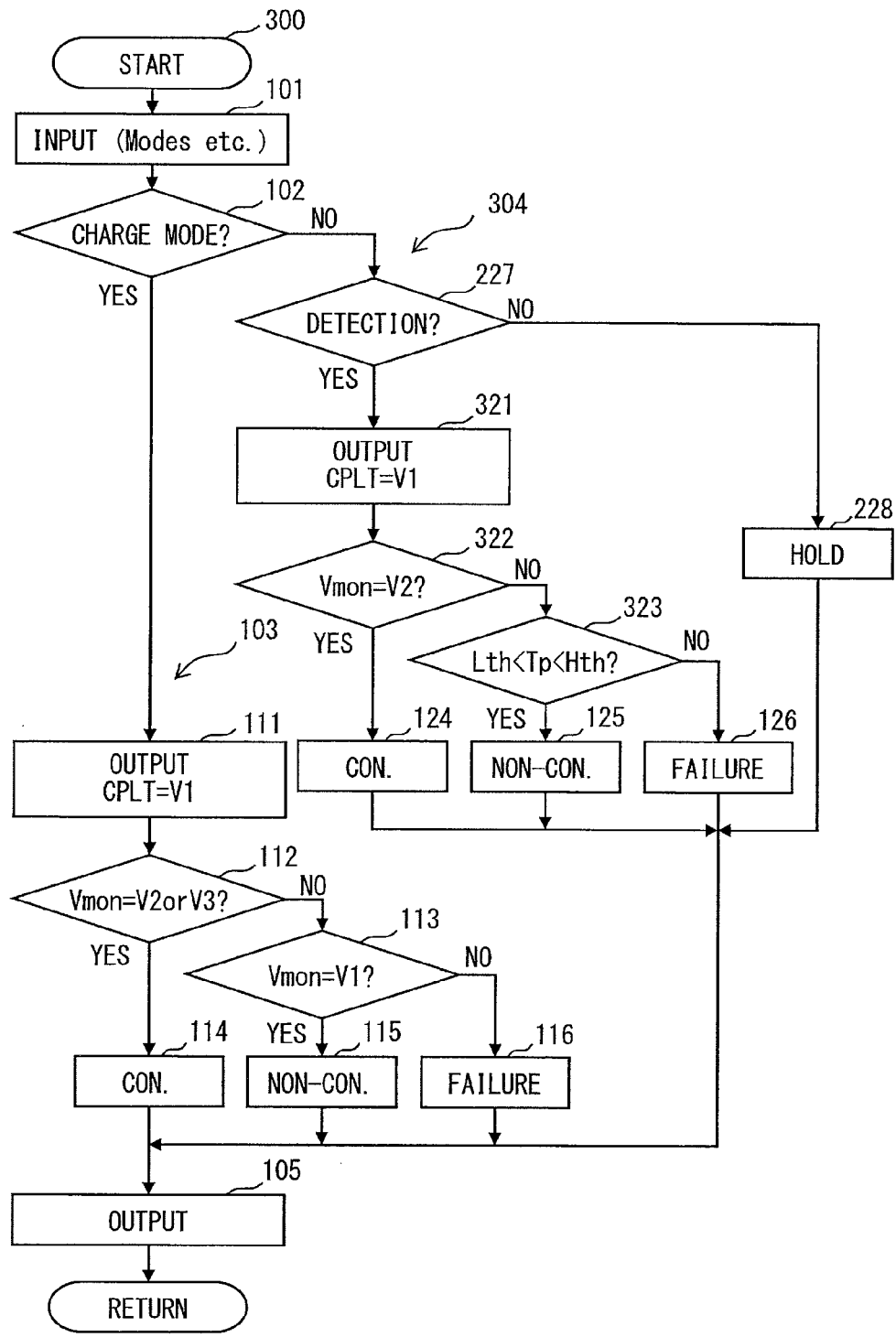
FIG. 7 is a flow chart showing a process in a third embodiment.

In this embodiment, the structure shown in FIG. 1 and described is adopted. Instead of the flowchart in FIG. 2, the flowchart of FIG. 7 is adopted. A process 300 is performed in this embodiment. The process 300 has a step group 304 instead of the step group 204. Step group 304 provides a connection check function in the non-charge mode.

In step 227, it is determined that whether a detection timing, which is predetermined intermittently, comes or not. If a detecting timing comes, the routine branches to YES and progresses to step 321. In step 321, the monitor signal is outputted to the signal line SGL by the monitor signal source 2i. The monitor signal is a signal which is not used in the normal CPLT method and is different from signals used in the normal CPLT method. The monitor signal is characterized by voltage V1 with a short time pulse form. As a result, voltage V1 is outputted as a pulse form to the output terminal CPLT. Although the voltage V1 of the monitor signal is the same as the usual CPLT method, it differs from the usual CPLT method in that the monitor signal is pulse form. The pulse width Tp of the monitor signal is shorter than the response time Twu which is necessary for the restart section 3f to start an action to restart the vehicle controller 3c in response to a voltage detection by the voltage detecting section 3e. For example, the pulse width Tp can be set to 10 microseconds. The routine progresses to step 322 after performing step 321.

In step 322, the voltage Vmon detected by the voltage detecting section 2j is evaluated. In a case that the voltage Vmon is equal to the voltage V2 (Vmon=V2) indicative of the connection state, the routine progresses to step 124 from step 322. In a case that the voltage Vmon is not equal to the voltage V2 indicative of the connection state, the routine progresses to step 323.

In step 323, it is determined that whether the pulse width Tp of the voltage Vmon detected by the voltage detecting section 2j is within a predetermined normal range or not. Here, it is determined that whether the pulse width Tp is longer than the lower limit Lth, and shorter than the upper limit Hth. If the pulse width Tp is within the normal range, the routine progresses to step 125. If the pulse width Tp is not within the normal range, the routine progresses to step 126. Step 323 and Step 126 provide an abnormality determining section which determines an abnormality of the stand communication section 2h based on the pulse width Tp.

FIG. 8 is a timing diagram showing an example of operation of this embodiment. An example of the response time Twu by which the restart section 3f restarts the vehicle controller 3c in a wake up manner is illustrated.

According to this embodiment, the monitor signal source 2i outputs only voltage V1 to the output terminal CPLT. Accordingly, the structure and/or control processing of devices in the charge stand 2 can be simplified.

(Other Embodiments)

The present disclosure is not limited to the above embodiments, and the present disclosure may be practiced in various modified embodiments. The present disclosure is not limited to the above combination, and disclosed technical means can be practiced independently or in various combinations. Each embodiment can have an additional part. The part of each embodiment may be omitted. The part of embodiment may be replaced or combined with the part of the other embodiment. The configurations, functions, and advantages of the above-mentioned embodiment are just examples. The technical scope of the present disclosure is not limited to the descriptions and the drawings. Some extent of the disclosure may be shown by the scope of claim, and also includes the changes, which is equal to and within the same range of the scope of claim.

For example, means and functions of the control device 10 may be provided by only software, only hardware or a combination of the software and the hardware. For example, the control device may be made of an analogue circuit.

In the preceding embodiments, in order to determine the connection state and the non-connection state of the connector 2c, a method comparing the voltage Vmon for determination with the predetermined threshold value Vth is adopted. Alternatively, a method determining whether the voltage Vmon is within a predetermined voltage range or not may be used for a determination of the connection state and the non-connection state, etc. For example, a voltage range containing the voltage which should be observed may be set as the predetermined voltage range. In the method, it is determined that whether the voltage Vmon is in this voltage range or not. In detail, a V4 voltage range having a predetermined width is set on both sides of the voltage V4, and a V5 voltage range having a predetermined width is set on both sides of the voltage V5 in a similar manner. These V4 voltage range and V5 voltage range are set up not overlap each other. In this case, the stand controller 2e determines that it is in the connection state or the non-connection state by using the V4 voltage range, the V5 voltage range and the voltage Vmon. Furthermore, a determining method using the threshold Vth and a determining method using the voltage range may have hysteresis characteristics to attain stable result of determination.

The pulse width Tp in the second embodiment may be set in any length. For example, the pulse width Tp in the second embodiment may be set long than the response time Twu. Since the voltage V4 is lower than the restart voltage Vwu, this structure can still reduce the restart of the controller disposed in ELVH 3. The pulse width Tp in the second embodiment may be set shorter than the response time Twu.

In the preceding embodiment, the choosing section provided by steps 101 and 102 chooses the second connection check section provided by step groups 104, 204, and 304 only in the non-charge mode. Alternatively, the choosing section may be configured to choose the second connection check section in the non-charge mode at least. For example, in the arrangement which permits the reverse current from ELVH 3 to the charge stand 2, the choosing section may be configured to choose the second connection check section only in the power-off mode. In this case, the first connection check section which provides the normal CPLT method is chosen in the charge mode and the discharge mode both of which are contained in the power-on mode. The second connection check section is chosen in the non-charge mode and the non-discharge mode both of which are contained in the power-off mode. The choosing section can be configured to choose the second connection check section the power-off mode at least. For example, it may be configured to choose the second connection check section also in the discharge mode in addition to the power-off mode. In this case, the first connection check section which provides the normal CPLT method is chosen only in the charge mode, and the second connection check section is chosen in the remaining modes, such as the non-charge mode, the discharge mode, and the non-discharge mode.

In the above-mentioned embodiments, the fault detection function provided by step 113 and step 116 may be removed. The fault detection function provided by step 123 and step 126 may be removed. The fault detection function provided by step 323 and step 126 may be removed. Furthermore, all of the above-mentioned fault detection functions may be removed. In these cases, a failed state may be handled similar to the non-connection state of the connector 2c.

In the above-mentioned embodiments, the charging device for vehicle is provided by the charge stand 2. Alternatively, the charging device for vehicle may be provided by a portable type battery charger connected between the output terminal of the grid power and ELVH. In the above-mentioned embodiments, the electric power converter 3b is mounted on ELVH 3. Alternatively, the electric power converter may be disposed on the charge stand 2 or the portable type battery charger. In the above-mentioned embodiments, the cable 2b and the connector 2c are disposed on the charge stand 2. Alternatively, a cable and a connector may be disposed on ELVH 3.

In the above-mentioned embodiments, the normal CPLT method was adopted in the charge mode. Alternatively, a pulse form monitor signal which was illustrated in the second or third embodiment may be applied to the signal line SGL in the charge mode.

What is claimed is:

1. An electric power supply controller for a vehicle, which charges from a charging device to a battery on a vehicle, the controller comprising:

a single signal line disposed in a connection device which electrically connects the charging device and the battery, and an impedance on the single signal line being changed corresponding to a connection state and a non-connection state of the connection device;

a first connection check section which determines the connection state or the non-connection state by monitoring the impedance on the single signal line while supplying a predetermined first monitor signal to the single signal line;

a second connection check section which determines the connection state or the non-connection state by monitoring the impedance on the single signal line while supplying a second monitor signal with less electric power than the first monitor signal to the single signal line; and a choosing section which chooses one of the first connection check section and the second connection check section; wherein the second monitor signal has a voltage lower than a voltage of the first monitor signal;

the first monitor signal has a voltage which is larger than a predetermined restart voltage by which a controller on the electric powered vehicle is restarted, and the second monitor signal has a voltage which is smaller than the restart voltage.

2. The electric power supply controller in claim 1, wherein the choosing section choses the first connection check section in a charge mode for charging from the charging device to the vehicle, and wherein the choosing section choses the second connection check section in a non-charge mode for not charging from the charging device to the vehicle.

3. The electric power supply controller in claim 1, wherein the second monitor signal has a pulse width which is shorter than a continuous time period of the first monitor signal.

4. The electric power supply controller in claim 3, wherein the first monitor signal has a continuous time period which is longer than a predetermined response time by which a controller on the electric powered vehicle is restarted, and wherein the pulse width of the second monitor signal is shorter than the response time.

5. The electric power supply controller in claim 3, wherein the second connection check section intermittently supplies the second monitor signal, and further comprising:

a holding section which holds a previous determined result during an idle time period following after a supplying time period of the second monitor signal.

6. The electric power supply controller in claim 1, wherein the first connection check section and the second connection check section observe the impedance of the single signal line by observing a voltage which appears on the single signal line given by the first monitor signal or the second monitor signal.

7. The electric power supply controller in claim 1, wherein the first connection check section and the second connection check section have an abnormality determining section which determines an abnormality of a circuit based on the first monitor signal and the second monitor signal.

8. The electric power supply controller in claim 7, further comprising an anti-abnormality measure section which performs a measure against the abnormality if the abnormality is determined in the abnormality determining section.

9. The electric power supply controller in claim 1, further comprising a signal setting section which sets up an electrical property of the first monitor signal and the second monitor signal so that the first monitor signal has a predetermined electrical property by which the controller on the electric powered vehicle is restarted, and the second monitor signal does not have the predetermined electrical property.

10. An electric power supply controller for a vehicle, which charges from a charging device to a battery on a vehicle, the controller comprising:

a single signal line disposed in a connection device which electrically connects the charging device and the battery, and an impedance on the single signal line being changed corresponding to a connection state and a non-connection state of the connection device;

a first connection check section which determines the connection state or the non-connection state by monitoring the impedance on the single signal line while supplying a predetermined first monitor signal to the single signal line;

a second connection check section which determines the connection state or the non-connection state by monitoring the impedance on the single signal line while supplying a second monitor signal with less electric power than the first monitor signal to the single signal line; and a choosing section which chooses one of the first connection check section and the second connection check section; wherein the second monitor signal has a pulse width which is shorter than a continuous time period of the first monitor signal;

the first monitor signal has a continuous time period which is longer than a predetermined response time by which a controller on the electric powered vehicle is restarted, and the pulse width of the second monitor signal is shorter than the response time.

11. The electric power supply controller in claim 10, wherein the choosing section choses the first connection check section in a charge mode for charging from the charging device to the vehicle, and wherein the choosing section choses the second connection check section in a non-charge mode for not charging from the charging device to the vehicle.

12. The electric power supply controller in claim 10, wherein the second monitor signal has a voltage lower than a voltage of the first monitor signal.

13. The electric power supply controller in claim 10, wherein the second connection check section intermittently supplies the second monitor signal, and further comprising:

a holding section which holds a previous determined result during an idle time period following after a supplying time period of the second monitor signal.

14. The electric power supply controller in claim 10, wherein the first connection check section and the second connection check section observe the impedance of the single signal line by observing a voltage which appears on the single signal line given by the first monitor signal or the second monitor signal.

15. The electric power supply controller in claim 10, wherein the first connection check section and the second connection check section have an abnormality determining section which determines an abnormality of a circuit based on the first monitor signal and the second monitor signal.

16. The electric power supply controller in claim 15, further comprising
an anti-abnormality measure section which performs a measure against the abnormality if the abnormality is determined in the abnormality determining section.

17. The electric power supply controller in claim 10, further comprising
a signal setting section which sets up an electrical property of the first monitor signal and the second monitor signal so that the first monitor signal has a predetermined electrical property by which the controller on the electric powered vehicle is restarted, and the second monitor signal does not have the predetermined electrical property.

18. An electric power supply controller for a vehicle, which charges from a charging device to a battery on a vehicle, the controller comprising:
a single signal line disposed in a connection device which electrically connects the charging device and the battery, and an impedance on the single signal line being changed corresponding to a connection state and a non-connection state of the connection device;
a first connection check section which determines the connection state or the non-connection state by monitoring the impedance on the single signal line while supplying a predetermined first monitor signal to the single signal line;
a second connection check section which determines the connection state or the non-connection state by monitoring the impedance on the single signal line while supplying a second monitor signal with less electric power than the first monitor signal to the single signal line; and
a choosing section which chooses one of the first connection check section and the second connection check section; wherein
the second monitor signal has a pulse width which is shorter than a continuous time period of the first monitor signal; and
the second connection check section intermittently supplies the second monitor signal, and further comprising:
a holding section which holds a previous determined result during an idle time period following after a supplying time period of the second monitor signal.

19. The electric power supply controller in claim 18, wherein
the choosing section choses the first connection check section in a charge mode for charging from the charging device to the vehicle, and wherein
the choosing section choses the second connection check section in a non-charge mode for not charging from the charging device to the vehicle.

20. The electric power supply controller in claim 18, further comprising
a signal setting section which sets up an electrical property of the first monitor signal and the second monitor signal so that the first monitor signal has a predetermined electrical property by which the controller on the electric powered vehicle is restarted, and the second monitor signal does not have the predetermined electrical property.

* * * * *